US008362856B2

(12) United States Patent
Quan et al.

(10) Patent No.: US 8,362,856 B2
(45) Date of Patent: Jan. 29, 2013

(54) RF TRANSITION WITH 3-DIMENSIONAL MOLDED RF STRUCTURE

(75) Inventors: Clifton Quan, Arcadia, CA (US); Fangchou Yang, Los Angeles, CA (US); Hee Kyung Kim, El Segundo, CA (US); Alberto F. Viscarra, Torrance, CA (US)

(73) Assignee: Raytheon Company, Waltham, MA (US)

( * ) Notice: Subject to any disclaimer, the term of this patent is extended or adjusted under 35 U.S.C. 154(b) by 333 days.

(21) Appl. No.: 12/620,467

(22) Filed: Nov. 17, 2009

(65) Prior Publication Data

US 2011/0115578 A1 May 19, 2011

(51) Int. Cl.
*H03H 7/38* (2006.01)

(52) U.S. Cl. .......................................... 333/238; 333/33

(58) Field of Classification Search .................... 333/33, 333/260, 238, 246

See application file for complete search history.

(56) References Cited

U.S. PATENT DOCUMENTS

| | | | |
|---|---|---|---|
| 3,004,229 | A | 10/1961 | Stearns |
| 4,853,660 | A | 8/1989 | Schloemann |
| 5,262,590 | A | 11/1993 | Lia |
| 5,408,240 | A | 4/1995 | Battista et al. |
| 5,633,615 | A | 5/1997 | Quan |
| 6,018,326 | A | 1/2000 | Rudisill |
| 6,061,245 | A | 5/2000 | Ingraham et al. |
| 6,366,185 | B1 | 4/2002 | Keesey et al. |
| 6,444,921 | B1 | 9/2002 | Wang et al. |
| 6,696,163 | B2 | 2/2004 | Yang |
| 6,871,396 | B2 | 3/2005 | Sugaya et al. |
| 6,992,629 | B2 | 1/2006 | Kerner et al. |
| 7,298,331 | B2 | 11/2007 | Oberly |
| 7,523,548 | B2 | 4/2009 | Kataoka et al. |
| 7,525,498 | B2 | 4/2009 | Quan et al. |
| 7,645,941 | B2 | 1/2010 | Wesselman et al. |
| 8,043,464 | B2 | 10/2011 | Kim et al. |
| 2005/0264448 | A1 | 12/2005 | Cox et al. |
| 2006/0097945 | A1 | 5/2006 | McCarville et al. |
| 2007/0025044 | A1 | 2/2007 | Golubovic et al. |
| 2007/0131451 | A1 | 6/2007 | Schmachtenberg, III et al. |
| 2007/0139275 | A1 | 6/2007 | Deaett et al. |
| 2008/0088519 | A1 | 4/2008 | Quan et al. |
| 2009/0165296 | A1 | 7/2009 | Carmi |
| 2009/0231226 | A1 | 9/2009 | Quan et al. |
| 2011/0113618 | A1 | 5/2011 | Viscarra et al. |
| 2011/0113619 | A1 | 5/2011 | Viscarra et al. |
| 2011/0115578 | A1 | 5/2011 | Quan et al. |

FOREIGN PATENT DOCUMENTS

| | | | |
|---|---|---|---|
| EP | 2 230 775 | A2 | 9/2010 |
| EP | 2 288 242 | A1 | 2/2011 |

(Continued)

OTHER PUBLICATIONS

Extended European Search Report for European Application No. 10251577.2, filed Sep. 10, 2010, Extended European Search Report dated Feb. 24, 2011 and mailed Mar. 4, 2011 (5 pgs.).

(Continued)

*Primary Examiner* — Stephen Jones

(74) *Attorney, Agent, or Firm* — Christie, Parker & Hale LLP

(57) ABSTRACT

A radio frequency (RF) transition for a three dimensional molded RF structure is provided. In one embodiment, the invention relates to a radio frequency (RF) transition for an RF structure, the RF transition includes an assembly having a first flexible layer, a second flexible layer, and a third flexible layer, wherein a first section of the assembly includes a microstrip transmission line, wherein a second section of the assembly includes a dielectric stripline transmission line, and wherein a third section of the assembly includes a suspended substrate stripline transmission line.

31 Claims, 4 Drawing Sheets

FOREIGN PATENT DOCUMENTS

| | | | |
|---|---|---|---|
| FR | 2 871 336 | A1 | 12/2005 |
| GB | 2 064 233 | A | 6/1981 |
| JP | 8 051279 | A | 2/1996 |
| JP | 9 281520 | A | 10/1997 |
| JP | 2001-135899 | A | 5/2001 |
| JP | 2001-189609 | A | 7/2001 |
| JP | 2003-347503 | A | 12/2003 |
| JP | 2007-221077 | A | 8/2007 |
| WO | WO 2008/045349 | A1 | 4/2008 |

OTHER PUBLICATIONS

Extended European Search Report for European Application No. 10251576.4, filed Sep. 10, 2010, Extended European Search Report dated Feb. 24, 2011 and mailed Mar. 4, 2011 (6 pgs.).

Office Action mailed May 16, 2011 for U.S. Appl. No. 12/620,562, filed Nov. 17, 2009, Inventor Alberto F. Viscarra, et al. (11 pgs.).

Extended European Search Report for European Application No. 10251312.4, filed Jul. 23, 2010, Extended European Search Report dated Nov. 23, 2010 and mailed Dec. 10, 2010 (6 pgs.).

Office Action mailed Jun. 8, 2011 for U.S. Appl. No. 12/620,544, filed Nov. 17, 2009, Inventor Alberto F. Viscarra, et al. (14 pgs.).

Extended search report for European Application No. 10251575.6-1248, Raytheon Company, European extended search report dated Jun. 8, 2011 and mailed Jun. 16, 2011 (8 pgs.).

Office action mailed May 9, 2012 for U.S. Appl. No. 12/534,077, filed Jul. 31, 2009, Inventor Clifton Quan, et al. (21 pgs.).

First Office Action mailed May 29, 2012 in Japan Patent Application No. 2010-171363, filed Jul. 30, 2010 (3 pages).

English translation of First Office Action mailed May 29, 2012 in Japan Patent Application No. 2010-171363, filed Jul. 30, 2010 (4 pages).

RF TRANSITION WITH 3-DIMENSIONAL MOLDED RF STRUCTURE

STATEMENT REGARDING FEDERALLY SPONSORED RESEARCH

This invention was made with Government support from the Defense Advanced Research Projects Agency (DARPA) for the Integrated Sensor Is Structure (ISIS) program and under contract number FA8750-06-C-0048. The U.S. Government has certain rights in this invention.

BACKGROUND

The present invention relates generally to a radio frequency (RF) transition for a three dimensional molded RF structure. More specifically, the invention relates to an RF transition from a microstrip transmission line to a suspended substrate transmission line used in conjunction with the RF structure.

Next generation large area multifunction active arrays for applications such as space and airborne based antennas need to be lighter weight, lower cost and more conformal than what can be achieved with current active array architecture and multilayer active panel array development. These space and airborne antennas can be used for radar and communication systems, including platforms such as micro-satellites and stratospheric airships.

As the next generation antennas are designed, new challenges for transmission lines on those antennas are presented. Such transmission lines provide pathways for RF signals used in conjunction with the antennas. There are several types of transmission lines and each type of RF transmission line has advantages based on the structure of the antenna at a given point. As the structure of the antennas varies at different locations on the antenna, a transition from one type of transmission line to another can be very useful.

SUMMARY OF THE INVENTION

Aspects of the invention relate to a radio frequency (RF) transition for a three dimensional molded RF structure. In one embodiment, the invention relates to a radio frequency (RF) transition for an RF structure, the RF transition includes an assembly having a first flexible layer, a second flexible layer, and a third flexible layer, wherein a first section of the assembly includes a microstrip transmission line, wherein a second section of the assembly includes a dielectric stripline transmission line, and wherein a third section of the assembly includes a suspended substrate stripline transmission line.

In another embodiment, the invention relates to a radio frequency (RF) transition for an RF structure, the RF transition including a first flexible layer having at least one flat portion and at least one folded portion, wherein the at least one flat portion of the first flexible layer comprises a microstrip transmission line having a signal trace on a first surface of the first flexible layer and a ground plane on a second surface of the first flexible layer, a second flexible layer having at least one first flat portion and at least one second flat portion, a third flexible layer having at least one flat portion, corresponding to the at least one flat portion of the first flexible layer, and at least one folded portion, corresponding to the at least one folded portion of the first flexible layer, wherein the at least one folded portion of the first layer, the at least one second flat portion of the second layer, and the at least one folded portion of the third layer comprise a suspended stripline transmission line including a signal trace on a first surface of the second layer, a ground plane on the first surface of the first layer, a ground plane on a first surface of the third layer, a first air channel disposed between the at least one folded portion of the first layer and the at least one second portion of the second layer, and a second air channel disposed between the at least one second portion of the second layer and the at least one folded portion of the third layer.

DETAILED DESCRIPTION OF THE INVENTION

Figure 1:
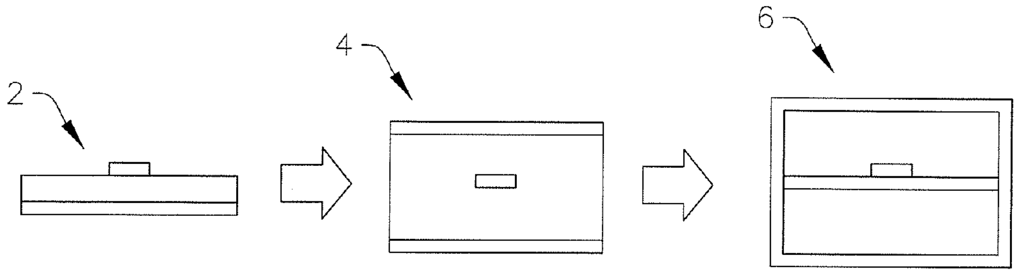
FIG. 1 is a concept flow diagram of transitions from a microstrip transmission line to a dielectric stripline transmission line and then to a suspended substrate stripline transmission line in accordance with one embodiment of the invention.

Referring now to the drawings, embodiments of RF transitions/assemblies are illustrated. The RF transitions/assemblies provide a transition from a first transmission line such as microstrip to a second transmission line such as suspended substrate stripline. In a number of embodiments, the transitions include an intermediate transmission line such as dielectric stripline. Many embodiments of the RF transitions include an assembly having a first flexible layer, a second flexible layer and a third flexible layer. In such case, a first section of the assembly can provide a microstrip transmission line, a second section of the assembly can provide a dielectric stripline transmission line, and a third section of the assembly can provide a suspended substrate stripline transmission line. These sections can run in sequence such that the second section is after the first section and the third section is after the second section, thereby providing a transition from microstrip to dielectric stripline and then to suspended substrate stripline.

In several embodiments, the first and second sections can be sandwiched sections where the second layer is sandwiched between the first and third layers and intervening adhesive layers disposed on each surface of the second layer. An RF signal trace can be disposed on the top of the first layer while a ground plane can be disposed on the bottom of the first layer, thereby forming the microstrip transmission line. A first plated thru hole or via can connect the signal trace of the first layer to a second signal trace on the top of the second layer, where the plated via extends from the top of the first layer to the top of the second layer. A second plated via can connect the ground plane of the first layer to a ground plane of the third layer, where the plated via extends from the bottom of the first layer, through the second layer, to the top of the third layer. Just after the plated vias disposed in the three layer assembly, the second section is defined by the second signal trace on the second/middle layer, adhesive dielectric layers above and below the second layer, and the ground planes of the first and third layers, thereby forming a dielectric stripline transmission line.

In a number of embodiments, the second section leads into the third section. In several embodiments, the third section includes the first layer disposed above the second layer and the third layer disposed below the second layer where air channel layers are disposed therebetween forming an expanded section in contrast to the sandwiched sections. In such case, the second signal trace extends along the top surface of the second layer, while ground planes are disposed on the bottom of the first layer and top of the third layer, thereby forming a suspended substrate stripline transmission line. While not bound by any particular theory, a channelized suspended substrate stripline can be the lowest loss printed circuit transmission line media for a particular RF band (e.g., X-Band).

In some embodiments, the incident RF signals travel along the top of the first layer for the first and/or second sections (e.g., sandwiched sections) of the RF transition assembly. In other embodiments, the incident RF signals travel along the top of the first layer for the third section (expanded section) of the RF transition assembly. In a number of embodiments, the layers are formed using a liquid crystal polymer (LCP) material.

FIG. 1 is a concept flow diagram of transitions from a microstrip transmission line 2 to a dielectric stripline transmission line 4 and then to a suspended substrate stripline transmission line 6 in accordance with one embodiment of the invention. The microstrip transmission line 2 includes a signal trace disposed on a middle dielectric layer which is disposed on a ground plane. The dielectric stripline transmission line 4 includes a signal trace surrounded by a dielectric material and a top ground plane layer and a bottom ground plane layer at the outer boundaries of the dielectric material. The suspended substrate stripline transmission line 6 includes a signal trace disposed on a middle substrate layer having air channels above and below the substrate layer, and a top ground plane layer and a bottom ground plane layer defining outer boundaries of the air channels.

Figure 2:
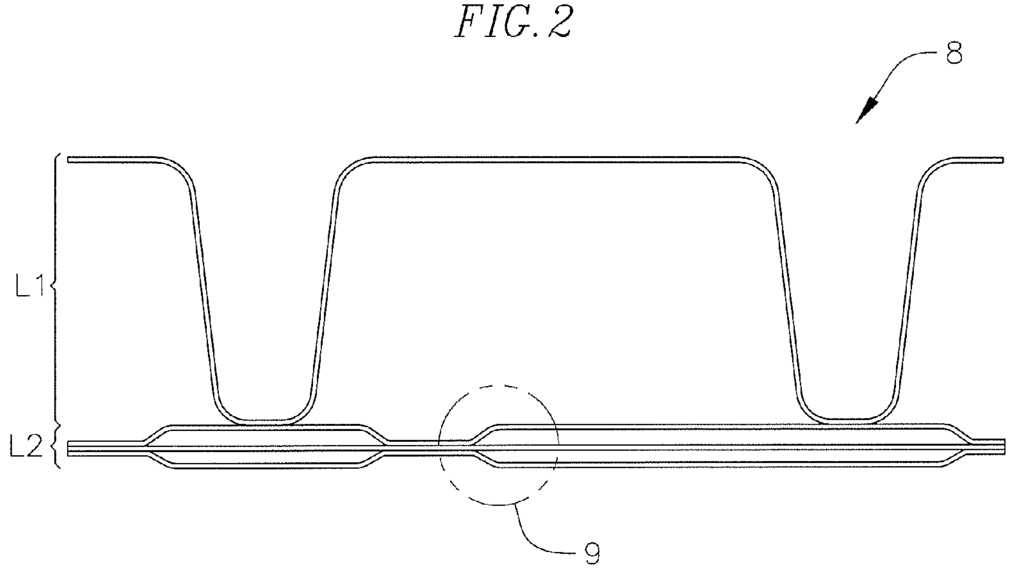
FIG. 2 is a cross-sectional view of a RF antenna structure including a level one RF feed and a level two RF feed having at least one RF transition in accordance with one embodiment of the invention.

FIG. 2 is a cross-sectional view of a RF antenna structure 8 including a level one RF feed (L1) and a level two RF feed (L2) having at least one RF transition 9 in accordance with one embodiment of the invention. In some embodiments, the RF antenna structure can be formed of corrugated printed circuit boards (PCBs). Systems and methods for interconnecting components of corrugated PCBs for an RF antenna are described in U.S. patent application Ser. No. 12/534,077, filed on Jul. 31, 2009, the entire content of which is incorporated by reference herein. In some embodiments, the RF antenna structure is an origami type antenna including a number of light-weight folded layers. In a number of embodiments, the layers are formed using a liquid crystal polymer (LCP) material. In other embodiments, the layers are formed using other suitable materials.

The level one (L1) RF feed for the RF antenna structure can be fabricated using specialized processes for shaping flexible circuit substrates. The fabrication process is described in a co-pending U.S. patent application Ser. No. 12/620,544, entitled "Process for Fabricating An Origami Formed Antenna Radiating Structure", now U.S. Pat. No. 8,127,432, the entire content of which is incorporated herein by reference. The level two (L2) RF assembly for the RF antenna structure can be fabricated using other specialized processes for shaping flexible circuit substrates. A process for fabricating a level two RF assembly for an RF antenna structure is described in co-pending U.S. patent application Ser. No. 12/620,562, entitled "Process for Fabricating A Three Dimensional Molded Feed Structure", the entire content of which is incorporated herein by reference. A novel method for bonding the lightweight level one and level two RF feeds is described in a co-pending U.S. patent application Ser. No. 12/620,490, entitled "Systems and Methods for Assembling Lightweight RF Antenna Structures", now U.S. Pat. No. 8,043,464, the entire content of which is incorporated herein by reference. In many embodiments, the novel bonding method produces a lightweight robust RF antenna structure that can used in radar and communication systems.

Figure 3:
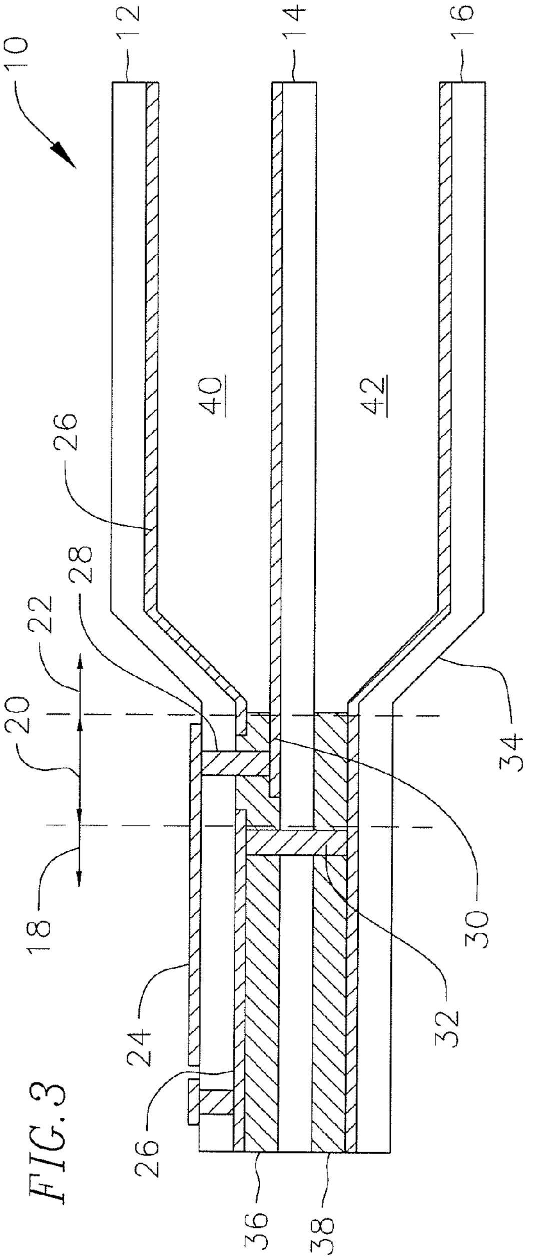
FIG. 3 is a cross-sectional view of a portion of a level two RF assembly including an RF transition from microstrip to dielectric stripline and then to suspended substrate stripline in accordance with one embodiment of the invention.

FIG. 3 is a cross-sectional view of a portion of a level two RF assembly including an RF transition 10 from microstrip to dielectric stripline and then to suspended substrate stripline in accordance with one embodiment of the invention. The RF transition assembly 10 includes a first flexible layer 12, a second flexible layer 14, and a third flexible layer 16. The three layer assembly can be divided into three sections, including a first section 18 adjacent to a second section 20 adjacent to a third section 22. The assembly components in the first section 18 can form a microstrip transmission line. More specifically, in the first section 18, the first layer 12 has a signal trace (e.g., microstrip trace) 24 on a top surface of the first layer 12, and a ground plane 26 on a bottom surface of the first layer 12.

The assembly components is the second section 20 can form a dielectric stripline transmission line. More specifically, a plated thru hole via 28 provides a connection from the signal trace 24 of the first layer 12 to a signal trace 30 (e.g., dielectric stripline trace) disposed on the top surface of the second layer 14. The plated thru hole via 28 extends from the top surface of the first layer 12, through the first layer 12, to the top surface of the second layer 14. A second plated thru hole via 32 electrically connects the ground plane 26 of the first layer 12 to a ground plane 34 of the third layer 16. For the first section 18 and second section 20, the RF transition 10 forms a sandwiched section where the second layer 14 has a top adhesive layer 36 disposed on the top surface of the second layer 14 and a bottom adhesive layer 38 disposed on the bottom surface of the second layer 14, and the first layer 12 is disposed on the outer surface of the top adhesive layer 36 and the third layer 16 is disposed on the outer surface of the bottom adhesive layer 38. For the second section 20, the sandwiched configuration of a middle signal trace 30 surrounded by dielectric layers (36, 38) and ground planes (26, 34) forms the dielectric stripline transmission line.

The assembly components of the third section 22 forms a suspended substrate stripline transmission line. As such, the first layer 12 and the third layer 16 are flared or folded outward to form air channels (40, 42) both above and below the second layer 14. The ground planes (26, 34) of the first and second sections (18, 20) extend along the inner surfaces of the first layer 12 and third layer 16, respectively. An RF signal trace 30, coupled to the signal trace of the second section, extends along the top of the second layer 14, which together along with the ground planes (26, 34) and air channels (40, 42), forms the suspended substrate stripline transmission line.

In a number of embodiments, the first, second and third layers are formed of a liquid crystal polymer (LCP) material. In some embodiments, the LCP layers are 0.1 millimeter thick. The signal traces and ground planes can be formed of copper and/or aluminum. In a number of embodiments, the microstrip transmission line is designed to have a 50 ohm impedance. The dielectric stripline and suspended substrate stripline transmission lines can be designed to have an impedance matching the microstrip transmission line (e.g., 50 ohms). Other characteristics such as the dimensions of the air channels and adhesive layers, and the placement of plated vias with respect to the signal traces, can be selected to achieve a preselected impedance (e.g., 50 ohms) for each of the transmission lines. In several embodiments, the microstrip, dielectric stripline and suspended substrate stripline transmission lines are coupled to common ground planes using plated vias.

Figure 4:
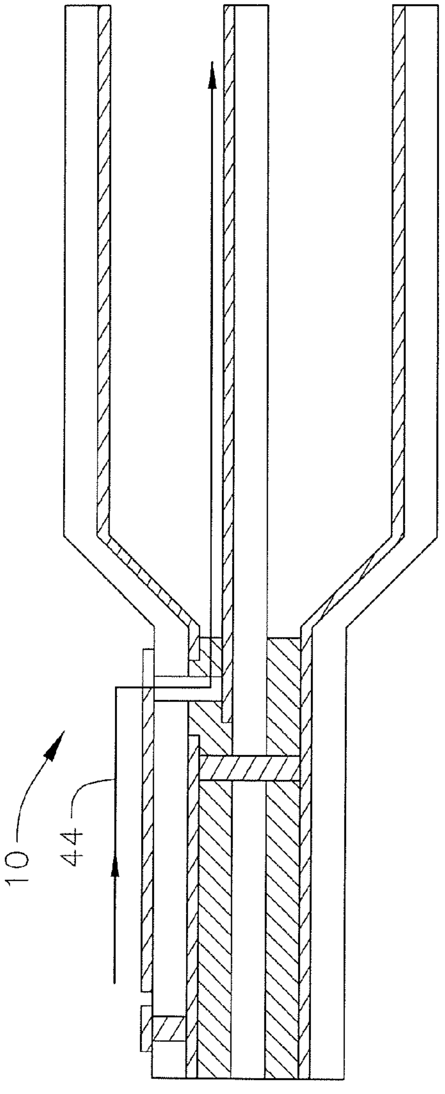
FIG. 4 is a cross-sectional view of the portion of the level two RF assembly of FIG. 3 illustrating the path of an RF signal through the RF transition.

FIG. 4 is a cross-sectional view of the portion of the level two RF assembly of FIG. 3 illustrating the path of an RF signal 44 through the RF transition 10.

Figure 5:
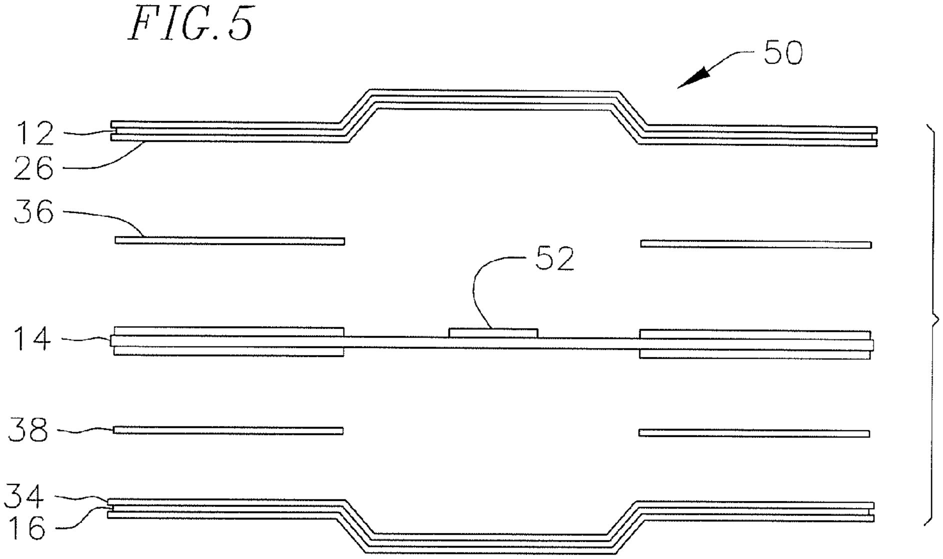
FIG. 5 is a exploded cross sectional view of a level two RF assembly in accordance with one embodiment of the invention.

FIG. 5 is a exploded cross sectional view of a level two RF assembly 50 including an RF transition in accordance with one embodiment of the invention. The assembly includes the first flexible layer 12, the second flexible layer 14, and the third flexible layer 16 separated by adhesive dielectric layers (36, 38). Power and signal lines can be routed on the top surface of the first layer 12. A ground plane 36 can be disposed on a bottom surface of the first layer 12. Ground planes and interconnects can be disposed on the top and bottom surfaces of the second layer for the sandwiched sections of the assembly 50. An RF feed/signal trace 52 is disposed on the top surface of the second layer 14 in a center area of the channel formed by the folded sections of the first layer 12 and the third layer 16. The top surface of the third layer 16 includes a ground plane 34, and the bottom surface of the third layer 16 can include ultra high frequency (UHF), phototonic, power electronic, or other circuitry.

Figure 6:
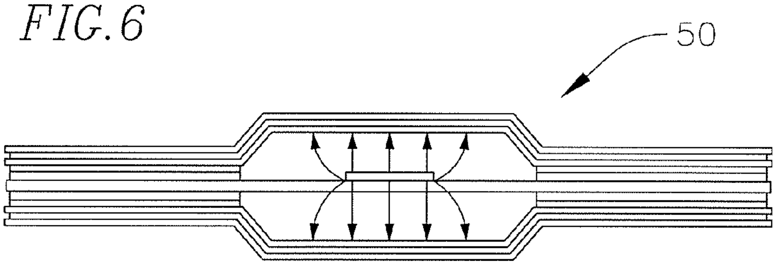
FIG. 6 is a cross sectional view of the level two RF assembly of FIG. 5 illustrating the propagation of RF energy within an expanded section of the assembly.

FIG. 6 is a cross sectional view of the level two RF assembly 50 of FIG. 5 illustrating the propagation of RF energy within the assembly 50.

Figure 7:
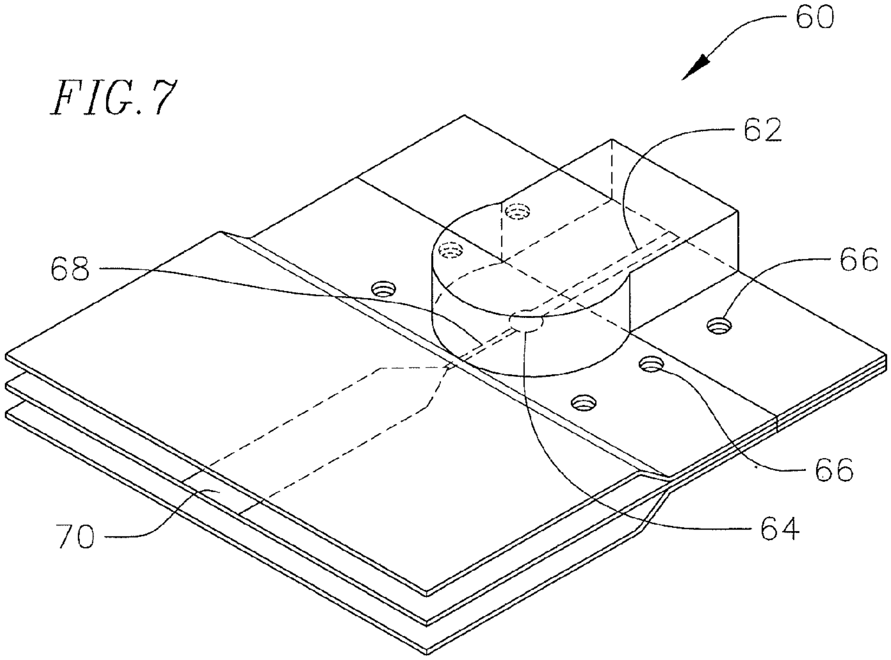
FIG. 7 is a perspective view of a section of a level two RF assembly including an RF transition from microstrip to dielectric stripline and then to suspended substrate stripline in accordance with one embodiment of the invention.

FIG. 7 is a perspective view of a section of a level two assembly 60 including an RF transition from microstrip to dielectric stripline and then to suspended substrate stripline in accordance with one embodiment of the invention. The assembly 60 includes a three layer assembly having a sandwiched portion and an expanded portion. The top layer of the assembly 60 includes an elongated RF signal trace 62 that extends to a plated via 64, and a number of plated vias 66 for making ground plane connections. An RF signal traveling along signal trace 62 extends to the second layer (middle layer) and continues along another RF signal trace 68. At the formed or expanded portion of the three layer assembly, an expanded/thick RF signal trace 70 is connected with the relatively narrow RF signal trace 68. In a number of embodiments, the assembly 60 includes some or all of the components described above in reference to the assembly of FIG. 3.

Figure 8:
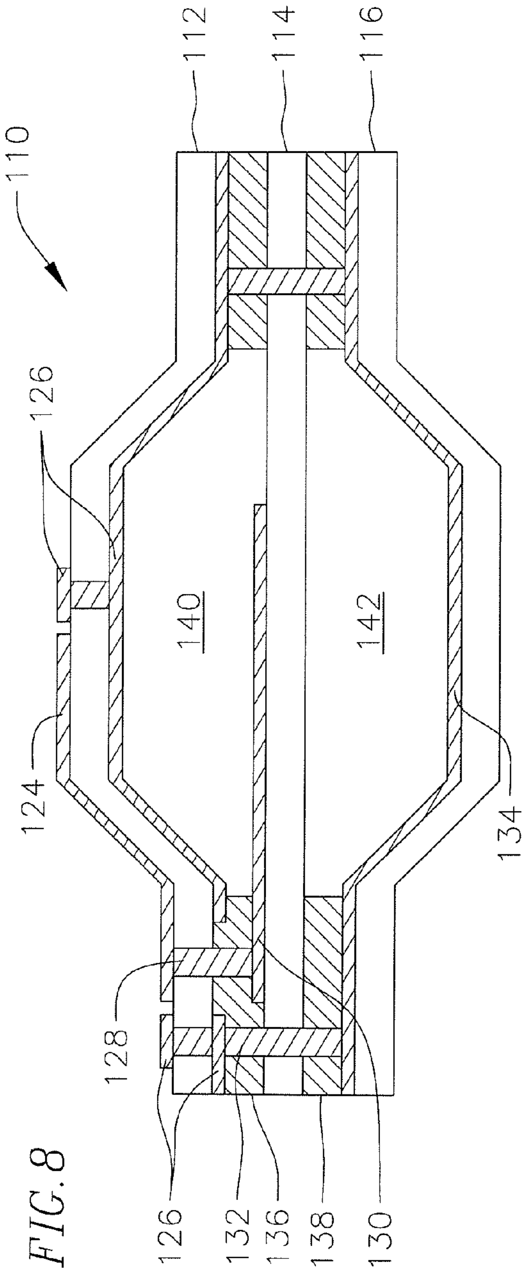
FIG. 8 is a cross-sectional view of a section of a level two RF assembly where the section includes an RF transition from microstrip to dielectric stripline and then to suspended substrate stripline in accordance with one embodiment of the invention.

FIG. 8 is a cross-sectional view of a section of a level two assembly 110 where the section includes an RF transition from microstrip to dielectric stripline and then to suspended substrate stripline in accordance with one embodiment of the invention. In a number of embodiments, the RF transition assembly 110 is similar to the assembly of FIG. 3, except that the incident microstrip transmission line is routed along the top of the folded section of the first layer 112 rather than along the top of a sandwiched or flat section of the assembly.

The RF transition assembly 110 includes a first flexible layer 112, a second flexible layer 114, and a third flexible layer 116. A microstrip RF signal trace 124 is positioned on a top surface of the first layer 112 and is routed along the folded/expanded section of the first layer 112. A ground plane 126 is disposed along a bottom surface of the first layer 112. A plated via 128 extends through the first layer 112 to connect the microstrip RF signal trace 124 with a dielectric stripline signal trace 130 on the second layer 114. A second plated via 132 extends through both the first layer 112 and the second layer 114 to connect ground planes (126, 134). Adhesive dielectric layers (136, 138) separate the second/middle layer 114 from the first layer 112 and third layer 116 at the sandwiched sections of the assembly. In the middle expanded or folded section, the first layer 112 and the third layer 116 are folded outwards to form air channels (140, 142) above and below the second layer 114.

In a number of embodiments, the assembly can operate in a similar fashion as the assembly of FIG. 3.

Figure 9:
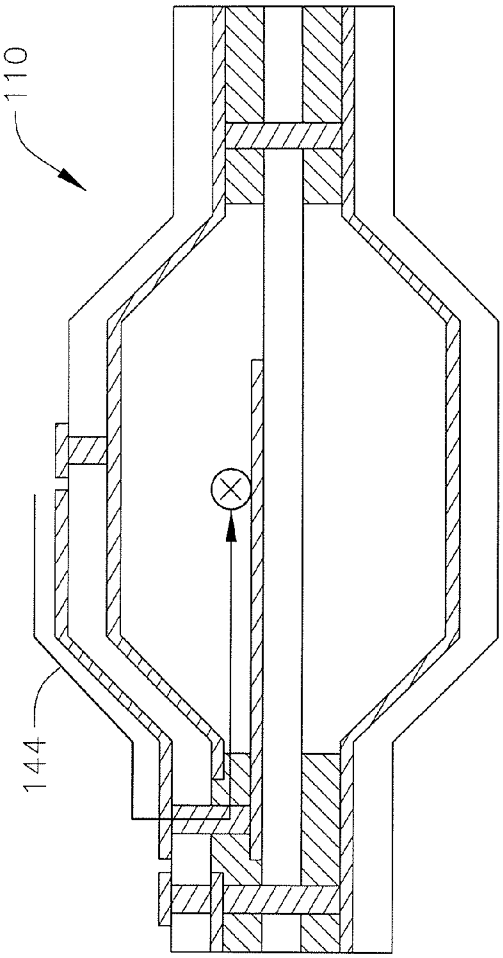
FIG. 9 is a cross-sectional view of the section of the level two RF assembly of FIG. 8 illustrating the path of an RF signal through the RF transition.

FIG. 9 is a cross-sectional view of the section of the level two RF assembly 110 of FIG. 8 illustrating the path of an RF signal 144 through the RF transition.

A process that can be used to assemble the RF transitions/assemblies in accordance with some embodiments of the invention is now described. The level two (L2) sandwich assembly (to contain the new transitions) can start with a flat double clad LCP sheet processed with a semi-additive plating operation resulting in quarter ounce copper on both sides, ready for circuitization. The sheet can then be laser drilled, thru-hole-plated, imaged and etched using standard flex circuit processes and finally stencil printed with resistors for L2 RF feed Wilkinson power dividers.

The top and bottom covers of the L2 sandwich assembly can begin with 4 mil thick bare LCP sheets. The pieces can then be placed into an aluminum mold with a silicone rubber pressure pad. The steel plates are machined with the negative pattern of the suspended air stripline channel structure. The assembly is placed into a heated press. The LCP is then formed into a three dimensional sheet. Using alignment features molded into the part, the sheets are placed on a laser drilling machine and thru holes are drilled. The molded and drilled sheets are then plated first with a Titanium-Tungsten (TiW) adhesion layer, then with quarter ounce copper. The 3D molded, double clad sheets then have a thin layer of electrophoretic, photo-imageable resist applied on both sides. Using special processes, the resist is then exposed using an optical system which compensates for the three dimensional surface. The copper and then TiW layer are etched off leaving the signal and power traces across the molded, 3-D surface.

To assemble the sandwich structure, the bottom covers are placed into a vacuum fixture that sucks the covers down, making them flat. Tooling pins are placed in the vacuum fixture to help align the bottom cover, and also the other layers during the assembly process. Conductive and non-conductive adhesives are dispensed on the top of the bottom cover, which is actually the inside surface, and then the flat center sheet is placed on top. A flat plate is placed on top of the circuit and the assembly is placed in an oven to cure. After curing, adhesive is dispensed on the top side of the center circuit. The top cover is carefully placed and aligned onto the assembly. A plate with clearances for the airline features is laid on top of the assembly and the entire assembly is placed in the oven for curing.

The above description relates to one embodiment of a process for assembling components of the RF transition assemblies. In other embodiments, other suitable assembly processes can be used.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A radio frequency (RF) transition for an RF structure, the RF transition comprising:
- an assembly comprising:
  - a first flexible layer;
  - a second flexible layer; and
  - a third flexible layer;
- wherein a first section of the assembly comprises a microstrip transmission line;
- wherein a second section of the assembly comprises a dielectric stripline transmission line;
- wherein a third section of the assembly comprises a suspended substrate stripline transmission line; and
- wherein, for the second section:
  - the second layer is separated from the first layer by a first adhesive dielectric layer; and
  - the second layer is separated from the third layer by a second adhesive dielectric layer.

2. The RF transition of claim 1, wherein, for the first section:
- the second layer is separated from the first layer by the first adhesive dielectric layer; and
- the second layer is separated from the third layer by the second adhesive dielectric layer.

3. The RF transition of claim 1, wherein, for the third section:
- the second layer is separated from the first layer by a first air channel; and
- the second layer is separated from the third layer by a second air channel.

4. The RF transition of claim 1, wherein, for the second section and the third section:
- the second layer is separated from the first layer by a first air channel; and
- the second layer is separated from the third layer by a second air channel.

5. The RF transition of claim 1, wherein the second section is adjacent to the first section and the third is adjacent to the second section.

6. The RF transition of claim 1, wherein the first section and the second section are sandwiched sections, and the third section is an expanded section.

7. The RF transition of claim 1, wherein the microstrip transmission line is configured to have an impedance of 50 ohms.

8. A radio frequency (RF) transition for an RF structure, the RF transition comprising:
- an assembly comprising:
  - a first flexible layer;
  - a second flexible layer; and
  - a third flexible layer;
- wherein a first section of the assembly comprises a microstrip transmission line;
- wherein a second section of the assembly comprises a dielectric stripline transmission line;
- wherein a third section of the assembly comprises a suspended substrate stripline transmission line; and
- wherein the first layer, the second layer and the third layer each comprise a liquid crystal polymer material.

9. A radio frequency (RF) transition for an RF structure, the RF transition comprising:
- an assembly comprising:
  - a first flexible layer;
  - a second flexible layer; and
  - a third flexible layer;
- wherein a first section of the assembly comprises a microstrip transmission line;
- wherein a second section of the assembly comprises a dielectric stripline transmission line;
- wherein a third section of the assembly comprises a suspended substrate stripline transmission line;
- wherein the first section comprises a portion of the third section; and
- wherein the second section is a sandwiched section, and the first section and the third section comprise an expanded section.

10. A radio frequency (RF) transition for an RF structure, the RF transition comprising:
- an assembly comprising:
  - a first flexible layer;
  - a second flexible layer;
  - a third flexible layer;
  - a first signal trace on a top surface of the first flexible layer and a first ground plane on a bottom surface of the first flexible layer;
  - a first plated via coupled to the first signal trace and a second signal trace on a surface of the second layer; and
  - a second plated via coupled to the first ground plane and to a second ground plane on a surface of the third layer;
- wherein a first section of the assembly comprises a microstrip transmission line;
- wherein a second section of the assembly comprises a dielectric stripline transmission line; and
- wherein a third section of the assembly comprises a suspended substrate stripline transmission line.

11. The RF transition of claim 10, wherein, for the third section:
- the second layer is separated from the first layer by a first air channel; and
- the second layer is separated from the third layer by a second air channel.

12. The RF transition of claim 10, wherein the first layer, the second layer and the third layer each comprise a polymer material.

13. The RF transition of claim 10, wherein, for the second section of the assembly, the assembly comprises:
- a first adhesive dielectric layer disposed between the first layer and the second layer; and
- a second adhesive dielectric layer disposed between the second layer and the third layer.

14. The RF transition of claim 13, wherein the second signal trace extends from the second section into the third section.

15. The RF transition of claim 13, wherein the first section and the second section are sandwiched sections, and the third section is an expanded section.

16. The RF transition of claim 13:
- wherein the first section comprises a portion of the third section; and wherein the second section is a sandwiched section, and the first section and the third section comprise an expanded section.

17. A radio frequency (RF) transition for an RF structure, the RF transition comprising:

a first flexible layer comprising at least one flat portion and at least one folded portion, wherein the at least one flat portion of the first flexible layer comprises a microstrip transmission line having a signal trace on a first surface of the first flexible layer and a ground plane on a second surface of the first flexible layer;

a second flexible layer comprising at least one first flat portion and at least one second flat portion;

a third flexible layer comprising at least one flat portion, corresponding to the at least one flat portion of the first flexible layer, and at least one folded portion, corresponding to the at least one folded portion of the first flexible layer;

wherein the at least one folded portion of the first layer, the at least one second flat portion of the second layer, and the at least one folded portion of the third layer comprise a suspended stripline transmission line comprising:

a signal trace on a first surface of the second layer;

a ground plane on the first surface of the first layer;

a ground plane on a first surface of the third layer;

a first air channel disposed between the at least one folded portion of the first layer and the at least one second portion of the second layer; and a second air channel disposed between the at least one second portion of the second layer and the at least one folded portion of the third layer.

18. The RF transition of claim 17:

wherein the at least one flat portion of the first layer, the first flat portion of the second layer, and the at least one flat portion of the third layer comprise a dielectric stripline transmission line comprising:

a signal trace on the first surface of the second layer;

a ground plane on the first surface of the third layer;

a first dielectric layer disposed between the at least one flat portion of the first layer and the at least one second flat portion of the second layer; and a second dielectric layer disposed between the at least one second flat portion of the second layer and the at least one flat portion of the third layer.

19. A radio frequency (RF) transition for an RF structure, the RF transition comprising:

an assembly comprising:

a first flexible layer;

a second flexible layer; and a third flexible layer;

wherein a first section of the assembly comprises a microstrip transmission line;

wherein a second section of the assembly comprises a dielectric stripline transmission line;

wherein a third section of the assembly comprises a suspended substrate stripline transmission line; and wherein the first layer, the second layer and the third layer each comprise a polymer material.

20. The RF transition of claim 19, wherein the first layer, the second layer and the third layer each comprise a liquid crystal polymer material.

21. The RF transition of claim 19, wherein, for the first section and the second section:

the second layer is separated from the first layer by a first adhesive dielectric layer; and the second layer is separated from the third layer by a second adhesive dielectric layer.

22. The RF transition of claim 19, wherein, for the third section:

the second layer is separated from the first layer by a first air channel; and the second layer is separated from the third layer by a second air channel.

23. The RF transition of claim 19, wherein, for the second section:

the second layer is separated from the first layer by a first adhesive dielectric layer; and the second layer is separated from the third layer by a second adhesive dielectric layer.

24. The RF transition of claim 19, wherein the second section is adjacent to the first section and the third is adjacent to the second section.

25. The RF transition of claim 19, wherein the first section and the second section are sandwiched sections, and the third section is an expanded section.

26. The RF transition of claim 19:

wherein the first section comprises a portion of the third section; and wherein the second section is a sandwiched section, and the first section and the third section comprise an expanded section.

27. The RF transition of claim 19, wherein the first layer, the second layer and the third layer each comprise a dielectric material.

28. The RF transition of claim 19, wherein at least one of the first layer, the second layer, and the third layer comprises at least one flat portion and at least one folded portion.

29. The RF transition of claim 28, wherein an angle between the at least one flat portion and the at least one folded portion is greater than 90 degrees.

30. A radio frequency (RF) transition for an RF structure, the RF transition comprising:

an assembly comprising:

a first flexible layer;

a second flexible layer; and a third flexible layer;

wherein a first section of the assembly comprises a microstrip transmission line;

wherein a second section of the assembly comprises a dielectric stripline transmission line;

wherein a third section of the assembly comprises a suspended substrate stripline transmission line; and wherein, for the second section and the third section:

the second layer is separated from the first layer by a first air channel; and the second layer is separated from the third layer by a second air channel.

31. A radio frequency (RF) transition for an RF structure, the RF transition comprising:

an assembly comprising:

a first flexible layer;

a second flexible layer; and a third flexible layer;

wherein a first section of the assembly comprises a microstrip transmission line;

wherein a second section of the assembly comprises a dielectric stripline transmission line;

wherein a third section of the assembly comprises a suspended substrate stripline transmission line; and wherein the first layer, the second layer and the third layer each extend continuously through each of the first section, the second section, and the third section.

* * * * *